United States Patent [19]
Kahn et al.

[11] Patent Number: 5,138,368
[45] Date of Patent: Aug. 11, 1992

[54] FABRICATION OF PRINTED WIRING BOARDS BY PROJECTION IMAGING

[75] Inventors: Frederic J. Kahn, Palo Alto; Neil G. Bergstrom, Oakland; David E. Stepner, Cupertino, all of Calif.

[73] Assignee: Greyhawk Systems, Inc., Milpitas, Calif.

[21] Appl. No.: 318,522

[22] Filed: Mar. 1, 1989

Related U.S. Application Data

[63] Continuation-in-part of Ser. No. 262471, Oct. 25, 1988, abandoned.

[51] Int. Cl.⁵ .................. G03B 27/42; G02F 1/13
[52] U.S. Cl. .................................... 355/53; 359/43
[58] Field of Search .............. 355/53, 68; 350/351

[56] References Cited

U.S. PATENT DOCUMENTS

| | | | |
|---|---|---|---|
| 4,013,466 | 4/1977 | Klaiber | 96/36 |
| 4,110,039 | 8/1978 | Roder et al. | 355/68 |
| 4,110,762 | 8/1978 | Tigreat | 355/53 |
| 4,161,363 | 7/1979 | Kahle | 355/68 |
| 4,255,046 | 3/1981 | Corona | 355/68 |
| 4,350,438 | 9/1982 | Schroter | 355/68 |
| 4,603,968 | 8/1986 | Schmidt | 355/53 |
| 4,653,867 | 3/1987 | Urabe et al. | 350/351 |
| 4,657,379 | 4/1987 | Suwa | 355/53 |
| 4,696,550 | 9/1987 | Shionoya | 350/351 |
| 4,941,038 | 7/1990 | Walowit | 358/80 |
| 4,952,034 | 8/1990 | Azusawa et al. | 350/351 |
| 4,965,672 | 10/1990 | Duke et al. | 358/298 |

*Primary Examiner*—Monroe H. Hayes
*Attorney, Agent, or Firm*—Flehr, Hohbach, Test, Albritton & Herbert

[57] ABSTRACT

A hard copy such as a printed wiring board is fabricated by exposing to radiation a liquid crystal cell in which a desired pattern is written and directing the pattern-carrying radiation projected from the cell by transmission or reflection to a substrate which is coated with a material sensitive to the radiation and disposed alignedly at an exposure position by optical registration. The duration of the exposure is controlled for a given light intensity and for the type of the coating material. A pattern may be written in one cell substantially simultaneously as another cell is used for the projection imaging. After a produced pattern is compared with a reference pattern, corrections may be effected through a processor which controls the writing of a pattern in a cell.

25 Claims, 3 Drawing Sheets

FABRICATION OF PRINTED WIRING BOARDS BY PROJECTION IMAGING

This is a continuation-in-part, of application Ser. No. 262,471 filed Oct. 25, 1988, now abandoned.

BACKGROUND OF THE INVENTION

This invention relates to an apparatus for and a method of making a hard copy having a predetermined pattern and more particularly to an automated apparatus for and a method of fabricating a printed wiring board (PWB) by a projection imaging process.

Wiring circuits which are used in electrical assemblies are currently mass-produced by fabricating printed wiring boards incorporating a desired wiring circuit pattern. One approach to fabricating printed wiring boards is by depositing a coating onto a double-sided copper clad substrate in the form of a desired wiring circuit and placing such a substrate in an etching solution to dissolve the copper away except where it is protected by the coating. What is left is a copper pattern in the form of the desired wiring circuit. Holes are then drilled in the board and electrical connections are formed between the opposing surfaces of the substrate by copper plating. Alternatively, the holes may be drilled prior to the deposition of the patterned coating.

At present, the transfer of the wiring image to the substrate is done in one of the following two ways. The older way is to use the designer's taped wiring pattern to create a screen which, when laid over a copper clad substrate, acts to allow a coating material to transfer to the substrate only where the pattern originally existed. Until very recently, this was done totally manually. Recently, automated screening machines are coming to be used but various problems are experienced with this method. For example, the screen by this method requires frequent cleaning and this affects the production efficiency adversely. Also, the results obtained with this method are highly dependent on the operator, and the transferred pattern generally is not sufficiently sharp to satisfy the design requirement, i.e., the dimensions of the lines and spaces which should be less than 0.008–0.01 inches.

According to the newer approach to the fabrication of hard copies such as printed wiring boards, a wiring pattern image called a "phototool" is made on a photoplotter from data generated on a computer-aided design system. In this process, a printed wiring board substrate is coated with a solid photoresist film which adheres to the substrate and undergoes a polymerization process when exposed to controlled ultraviolet or visible light. A working copy of the phototool is positioned on top of the resist to block the light, thereby preventing polymerization of the resist beneath the wiring pattern image. The printed wiring board is then inserted into a solution that dissolves the polymerized photoresist, leaving a resist having a pattern similar to the wiring circuit pattern. This photoresist method can yield very fine lines and spaces down to 0.001–0.003 inches, but it is mostly a manual process and production rates are thus limited. Yields are also limited due to the intrinsic nature of hardcopy phototools, i.e., the tools may have defects due to their initial fabrication process and typically acquire additional defects with time and use due to dust and other particulates which settle on them and also due to damage created by handling as well as various contact and near contact printing operations requiring them to touch another surface.

Recent attempts to automate the exposure of the printed circuit board for the optical transfer of wiring pattern include the method of imaging directly onto the substrate with a finely focused ultraviolet (UV) or visible laser beam. The laser beam is actuated to move laterally across the face of the printed wiring board substrate by the use of mirrors, while the board itself moves longitudinally under the laser light by means of a moving table, thereby implementing a raster scan. By this method, however, the speed of the exposure, or equivalently the speed of optical transfer of the wiring pattern onto the resist, is limited by the serial nature of this exposure process and the intensity of the laser light which must directly polymerize the resist. Fundamental problems still exist with this process, such as the necessity to convert the original vector-formatted wiring pattern into a raster format, which requires considerable time and computer power.

Another fundamental problem is the inability to reproduce straight line edges for features which do not run parallel or perpendicular to the raster pattern. The sampling nature of raster imaging typically results in jagged line edges often referred to as "the jaggies" for such off-axis features. Additional fundamental problems with laser exposure system are reciprocity and nonlinearity due to the inherent high peak exposure intensities and interference effects due to use of coherent laser light. Furthermore, direct laser exposure systems operating in a raster mode have only one degree of modulation freedom, exposure intensity. Thus, feature resolution and exposure intensity cannot be independently controlled and optimized.

In addition, it is necessary to redraw the pattern with the laser for every new board that is being fabricated, which requires stringent precision of the mechanical components used for mounting the printed wiring board and scanning the laser. Furthermore, the process is only applicable to one side of the board at a time, since the mechanism to be used to translate the printed wiring board and to hold it flat precludes exposing both sides of the board simultaneously.

The PWB fabrication approach described above is typically referred to as "subtractive" because copper is subtracted from the board. It is known as a "print and etch" method because the etch-resistant coating is printed, followed by etching of the copper. An alternative "additive" PWB fabrication process involves plating. Here, copper is deposited on the board to create the wiring patterns. Both "additive" and "subtractive" PWB fabrication processes require creation of the wiring circuit pattern by a photolithographic process. For "subtractive" processes using negative working (photopolymerized) resists, the final wiring pattern will correspond to bright lines or patterns on an otherwise dark background. For "additive" processes using negative working resists, the final wiring patterns will correspond to dark lines or patterns on an otherwise bright background. The resolution, or ability to resolve fine details, is typically not as good for negative resists as for positive resists, i.e., resists in which the unexposed region remains after development and the exposed region is developed away. Thus, in some applications, it is desirable to use positive resists. The required exposure patterns for "additive" and "subtractive" PWB fabrication processes and negative and positive photoresists are summarized in Table 1.

TABLE 1

| PWB Process Type | Resist Type | Required Exposure for Wiring Pattern | Required Exposure Background |
|---|---|---|---|
| subtractive | negative | bright | dark |
| additive | negative | dark | bright |
| subtractive | positive | dark | bright |
| additive | positive | bright | dark |

Thus, in order to be applicable to both subtractive and additive PWB fabrication processes and to enable use of either positive or negative photoresists, it is required that the PWB exposure system be able to generate both bright-on-dark as well as dark-on-bright images of the desired wiring pattern.

It has been known to alternatively use thermally addressed liquid crystal (TALC) light valves for projection imaging as described, for example, by Robert A. Heinz and Robert C. Oehrle in "Rapid Generation of Complex Images with a Liquid Crystal" in the Western Electric Engineer (April, 1977). The authors, however, recognized that the use of TALCs introduces significant problems during implementation of such a system. Although Heinz and Oehrle speculated on the possibility of applying TALCs to direct projection printing on PWBs, they never showed a single pattern printed on a photoresist with a TALC nor did they show a PWB fabricated with a TALC. One of the problems is the lack of adequate contrast ratio because TALCs are not capable of high contrast ratios such as on the order of 1000:1 which was then considered absolutely necessary. Heinz' and Oehrle's own results showed a contrast ratio of 20:1 for an image resolution of 30 lines per inch on a TALC cell. Thus, even a 20:1 contrast ratio (50 times lower than that thought to be required) would require a 10 inch×10 inch active liquid crystal area for a PWB with 8000 features per linear dimension (board width divided by minimum feature size). Also, the application of ultraviolet light is problematical because it is difficult to make a transmission cell which transmits ultraviolet light, and if such a cell were used in the aforementioned authors' system, it would be rapidly degraded. If visible light is used, on the other hand, an arc lamp operating at 1 kW or more is needed in view of the resists in order to keep the exposure time reasonably short. This would then present a heating problem due to absorption of the light by residual absorption in the transmission cell. Furthermore, complex optics are required with the method with a transmission cell to enable writing and projection of the cell image simultaneously. Finally, the systems proposed by Heinz and Oehrle and by Klaiber (U.S. Pat. No. 4,014,466 issued March, 1977) would have inadequate production throughputs because they used a single cell and cell position for writing PWBs and because in order to create a bright image on a dark background, they required a two-step process, i.e., laser writing of the dark background followed by laser writing the bright pattern to be superposed on the dark background. With the single cell and cell position, the total time ($t_t$) to photoexpose a number (N) of PWBs would be given by the sum of the time ($t_p$) to write the wiring pattern on the cell and the number of boards (N) times the sum of the board alignment and change time ($t_a$) and exposure times ($t_e$). Thus, $$t_t = t_p + N(t_a + t_e).$$

For a pattern of typical complexity and current laser liquid crystal writing system technology, a typical $t_p$ may be about 450 seconds, a typical $t_e + t_a$ may be about 15 seconds. Thus, if fewer than 30 boards of a type are to be exposed, over half of $t_t$ is due to the cell pattern write time $t_p$. The industry trend is to use smaller board lot sizes. Typical throughput of a modern PWB production facility's automated line may be about 4 boards/minute. Thus, the typical times stated above would slow the production rate by a factor of 2 for a lot size N of 30 boards. This would be unacceptable.

In order to write bright-on-dark patterns, $t_p$ would become even larger, and PWB production throughput reduced further because it could take comparable times to write the dark background with the laser and to write the final bright-on-dark pattern. Thus, the typical pattern generation time would become 15 minutes rather than 7.5 minutes.

Prior art systems for fabrication of printed wiring boards used transmission cells or masks because it was believed that higher contrast ratios were achievable with transmission cells than with reflection cells. Although U.S. Pat. No. 4,013,466 issued to Klaiber at Western Electric in March, 1977 disclosed a method of preparing a circuit by utilizing a liquid crystal artwork master, Heinz and Oehrle also of Western Electric indicated in their paper in the April, 1977 issue of the Western Electric Engineer that while direct exposure of printed wiring boards is "theoretically possible", no system with practical (short) exposure time had been realized. In summary, the possibility of exposing PWBs with TALCs was discussed by various workers at Western Electric, but due to fundamental limitations in contrast, exposure time, and writing speed, it was never publicly demonstrated or reduced to practice.

SUMMARY OF THE INVENTION

It is therefore an object of the present invention in view of the above to provide an automated apparatus for and a method of fabricating a hard copy such as a printed wiring board which affords relatively short writing and exposure times, and thereby high production throughput.

It is another object of the present invention to provide such an apparatus and method which require only a low contrast ratio but still can produce high resolution images with improved addressability while using relatively simple optics.

It is still another object of the present invention to provide such an apparatus and method with which the need for a media-based phototool can be totally eliminated.

It is still another object of the present invention to provide such an apparatus and method with which corrections can be effected easily (on-line) on the produced pattern.

These corrections can be for purposes of wiring pattern modification, distortion or aberration correction, or for correction of spatial or temporal exposure or process nonuniformities. The above and other objects of the present invention are achieved by taking advantage of the respective merits of transmissive and reflective liquid crystal cells and by providing a new apparatus and method characterized as employing a pattern writing assembly and a pattern exposure assembly which can operate concurrently and separately with a plurality of image storing means such as liquid crystal cells. The pattern exposure assembly comprises an automatic optical registration apparatus whereby a substrate to be exposed is optimally positioned and an exposure control circuit which determines precisely the duration of exposure of the photoresist-coated substrate to radiation imaged from a memory device storing data describing the desired wiring circuit image.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

In the figures, components which are substantially identical are indicated by the same numerals.

DETAILED DESCRIPTION OF THE INVENTION

Figure 1:
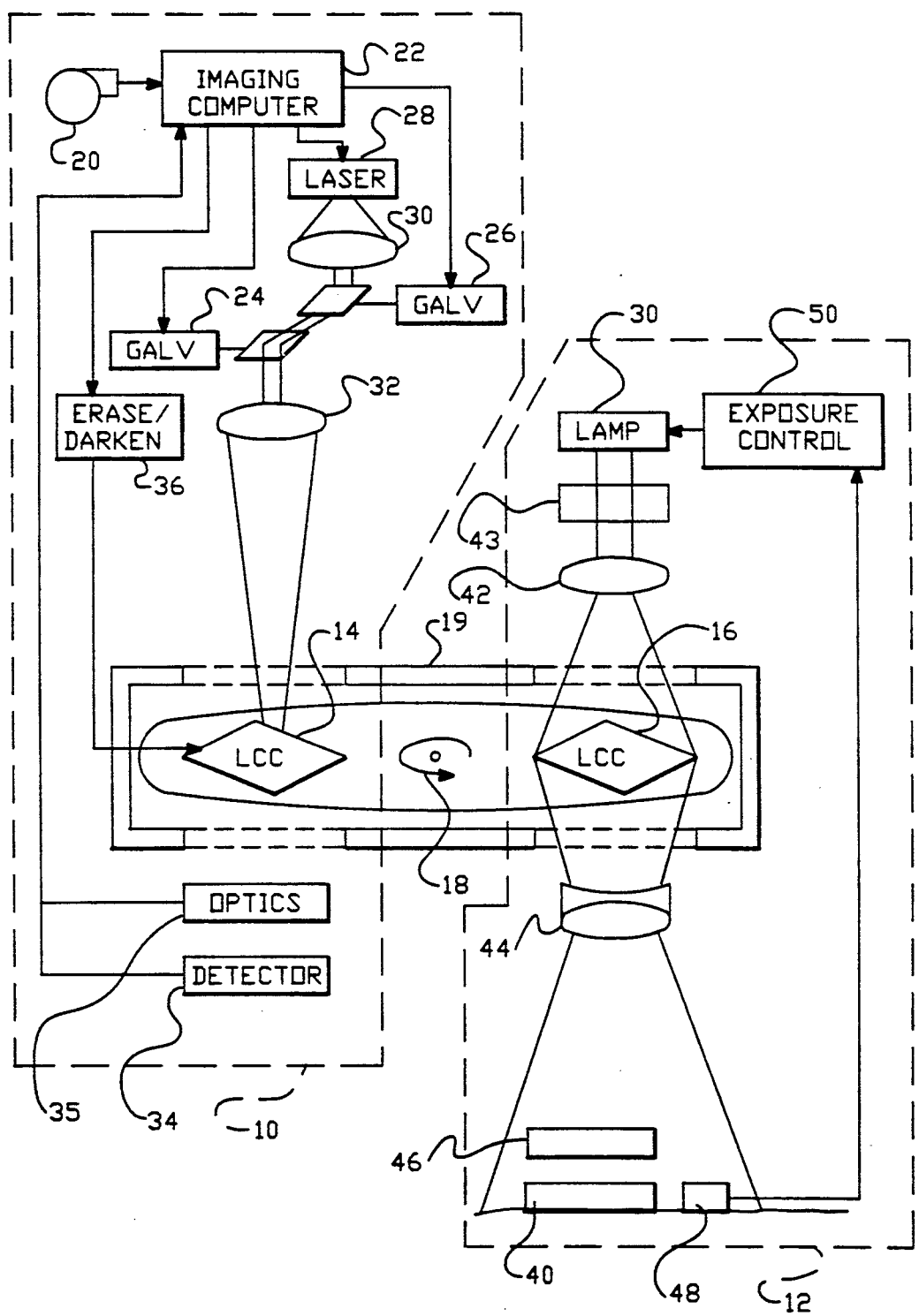
FIG. 1 a schematic and block diagram illustrating an apparatus with a pattern writing assembly and a pattern exposure assembly embodying the present invention.

With reference to FIG. 1 which schematically shows a preferred embodiment of the present invention, an apparatus for fabricating hard copies such as a printed wiring board is comprised of an image writing assembly 10 and an image exposure (and development) assembly 12, each associated with a liquid crystal cell (LCC) indicated respectively at 14 and 16 and capable of storing images in response to applied radiant energy. The LCCs 14 and 16 are securely positioned on a rotatable platform (or a wheel) 18 in proper alignment for writing of an image by the image writing assembly 10 and for exposure and development of a previously written image by the image exposure assembly 12. The wheel 18 is enclosed inside an oven 19 having optical windows such that a clean room is established therearound to keep dust and other damage-causing particulates away from the LCCs therein.

The LCCs 14 and 16 operate in a transmission mode and each comprise, in a preferred embodiment, a thin layer of liquid crystal which is in a smectic A liquid crystalline state at the operating ambient temperature controlled by the oven 19. Each cell includes two transparent substrates with transparent conducting electrodes coated over the inner surfaces and a thin liquid crystal layer sandwiched between the electrodes. As is well known for liquid crystal and other electro-optical devices, a variety of additional thin dielectric coatings can be deposited on the substrates and electrodes to minimize optical reflections, to orient the liquid crystal molecules, and to provide dielectric blocking. The liquid crystal layer can be made from a mixture of cyanoalkyl and cyanoalkoxy biphenyl molecules which is essentially transparent to both visible and near infrared light. In a preferred embodiment, the liquid crystal is doped with a small concentration of absorber which strongly absorbs the laser writing wavelength but absorbs a minimum amount of the projection wavelength light and thereby transmits most of the projection light. The liquid crystal may be one of the smectic A mixtures such as S2 available commercially from BDH Limited. The absorber may be an organic dye which is soluble in the liquid crystal, for example, 0.05 to 0.5% by weight of NK-1575 or NK-2772 (products of Nippon Kanko Shikiso Co.) as described by Urabe, et al., in J. Appl. Phys. 54, 1552-1558 (March, 1983) and Proc. SID, 25, 299-304 (April, 1984) or 0.2 to 2% by weight of MB-IR-17 or MB-IR-101 (products of Yamamoto Chemicals, Inc.), the former described by Nagae, et al., in SID 85 Digest, 289-292 (1985). The wavelength of maximum dye absorption and the laser writing wavelength should be chosen to coincide so as to achieve good writing speed and sensitivity. For example, NK-2772 has a peak absorption at about 780 nm, and would therefore be useful with commonly available GaAlAs semiconductor lasers emitting at or near that wavelength. Because different absorbers can be chosen to correspond to different laser wavelengths, however, this invention is not limited to either 780 nm wavelengths nor semiconductor lasers. Those skilled in the art will realize that different dye derivatives absorbing at different wavelengths and with suitable solubility in the liquid crystal can readily be synthesized. These dye derivatives, for example, may incorporate different end groups, side chains, chemical substitutions for one or several atoms, and be based on the basic (central) chromophore (absorber) chemical structures of the dyes cited as examples or on other chromophores which are well known to workers on dyes and to workers on laser recording materials and devices.

In order to write an image such as a wiring circuit pattern on a LCC, data representing the desired pattern are read from a prerecorded tape 20 (or disc) and loaded into an imaging computer 22. The imaging computer 22 serves to process the wiring circuit pattern data and provides command signals to positioning devices including, for example, galvanometers (GALV) or electric motors 24 and 26 attached respectively to a mirror and operating in a servo loop with positional feedback as explained, for example, by Heinz and Oehrle, ibid. The positioning devices 24 and 26 operate in response to the series of command signals from the imaging computer 22 to move a focused beam derived from a radiation source 28, which may preferably be a laser beam, for example, from a GaAlAs semiconductor laser emitting at a wavelength between 770 and 850 nm, the specific laser wavelength being chosen to coincide with the absorption wavelength of the laser absorber built in to LCCs 14 and 16, in a two-dimensional space, say, in x and y directions respectively across the face of the fixed LCC 14 at its position depicted in FIG. 1. The position of each galvanometer shaft is measured, for example, by a capacitance-based sensor consisting of four electrodes surrounding an electrically grounded rotor. Alternatively, the positions of the mirrors mounted to the galvanometers or motors 24 and 26 can be sensed optically as disclosed in U.S. Pat. No. 4,775,788 or by means of optical encoders incorporating a stationary part as well as a non-stationary part which rotates with the galvanometer or motor shaft. The beam is formed by directing the laser output through a beam forming optics 30. When the positioning devices 24 and 26 move the beam in the x and y directions relative to the surface of the LCC 14, a scan lens 32 serves to ensure that the beam remains focused on the surface of the LCC 14. A detector 34 and image verification optics 35 disposed adjacent to the LCC 14 sense changes in transmission of the laser beam through the cell and ensure by thus measuring changes in the optical properties of LCC 14 that the desired pattern is being, or has been, formulated correctly and that there are no defects in the cell that would prohibit the correct pattern from being written therein.

An erase/darken generator 36 serves to erase any pattern that has been written previously on the LCC 14 to allow a new image to be recorded. An example of an apparatus employing such an erasing means for erasing a recorded LCC is described in U.S. Pat. No. 3,796,999 issued Mar. 12, 1974 to F. J. Kahn. This electric field erase mode is used for erasure of dark-on-bright images. Alternatively, erase/darken generator 36 can be used to apply a short, areally uniform heating pulse to the entire LC to cause uniform darkening of the projected image as described by Kahn (*SID 87 Digest*, 254-257 (1987)) and in U.S. patent to be issued on application Ser. No. 169,097 filed Mar. 8, 1988 which is a continuation of U.S. patent application Ser. No. 914,640 filed Oct. 2, 1986. The aforementioned U.S. patent is herein incorporated by reference. This thermal darkening erase mode is used to erase bright-on-dark images. The LCC may be erased and used repetitively to store different patterns prior to exposure and development of desired patterns during fabrication of printed wiring boards. To fabricate printed wiring boards in accordance with the present invention, the LCC which has the desired wiring circuit image written previously therein is either deposited at or rotated on the wheel 18 to the exposure position indicated by the numeral 16 in proper alignment with a radiation source 38 and a substrate 40. The radiation source 38 comprises a projection lamp that has a wavelength (such as 436 nm from a compact, high-pressure Hg arc lamp) different from that of the laser beam source 28. The light from the projection lamp may be passed through a condenser lens assembly 42 and directed to the LCC 16. According to a preferred embodiment, a filter 43 is disposed between the arc lamp 38 and the condenser lens assembly 42 to pass radiation within a narrow bandwidth centered around 436 nm and to exclude, in particular, the 405 nm mercury line. This is because it is advantageous to use a narrow range of wavelengths centered around 436 nm to expose the resist since visible resists designed for PWB applications are relatively sensitive to that wavelength (enabling short exposures) and a number of dyes that strongly absorb in the near infrared, for example, with absorption maxima between 770 nm and 850 nm are relatively transparent at that wavelength as well (enabling both short exposures and longer LCC lifetimes than if the 405 nm mercury line were used as well). Although the desirability of a short exposure time would lead one to use the 405 nm mercury line as well, use of 436 nm light gives adequate exposure times, improves cell lifetimes, and simplifies the design of the projection optics. The light is transmitted through the patterned LCC 16 which contains writing lighting light absorbers with very little absorption at the projection wavelength and the entire illuminated image is directed to a projection lens 44. The projection lens 44 magnifies the transmitted image which is passed through a filter or correction plate 46 to ensure uniform intensity of the patterned light prior to impacting the substrate 40.

A photoresist layer that is coated on the surface of the substrate 40 receives the entire light image in parallel, at one time (that is, not serially), and an essentially latent image of the wiring circuit pattern is formed thereon. A detector 48 (such as a photodiode) positioned closely adjacent to the surface of the substrate 40 measures the amount of incident light that falls on the imaging plane of the substrate 40 and passes the measurement information to an exposure control circuit 50. The exposure control circuit 50 computes the total dose and electronically controls a shutter to initiate and terminate exposure by the projection lamp when a predetermined dose has been delivered, depending upon the information received from the detector 48 and the type of resist used with the substrate 40. The photoresist pattern is developed in a manner well known in the art and processed to produce the desired wiring circuit device or printed wiring board. Exposure of 5 seconds or less may be sufficient with visible light of wavelength 436 nm.

Figure 2A:
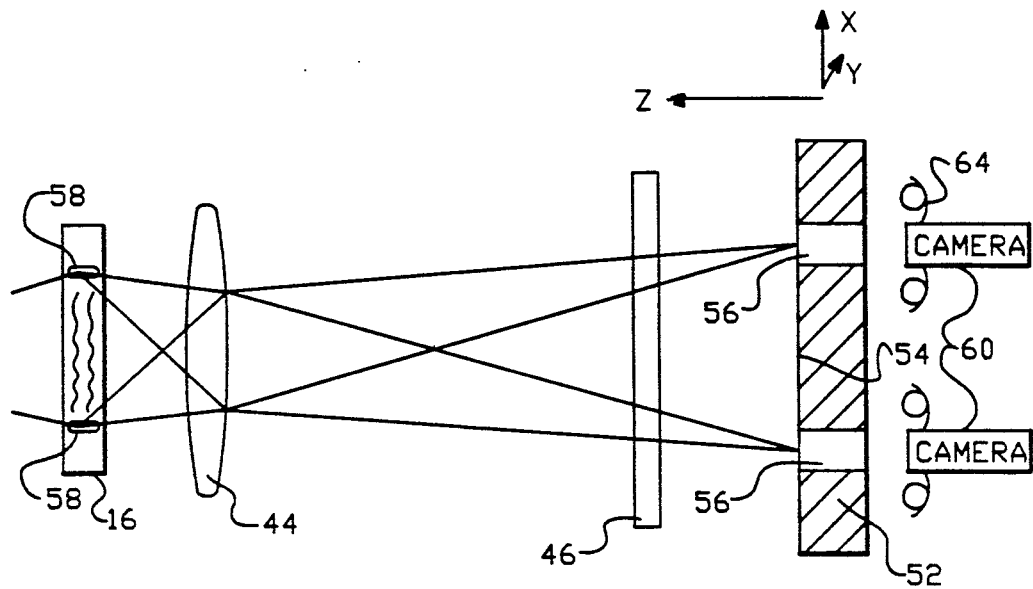
FIGS. 2A and 2B are schematic drawings showing an optical registration apparatus and method of the present invention.
Figure 2B:
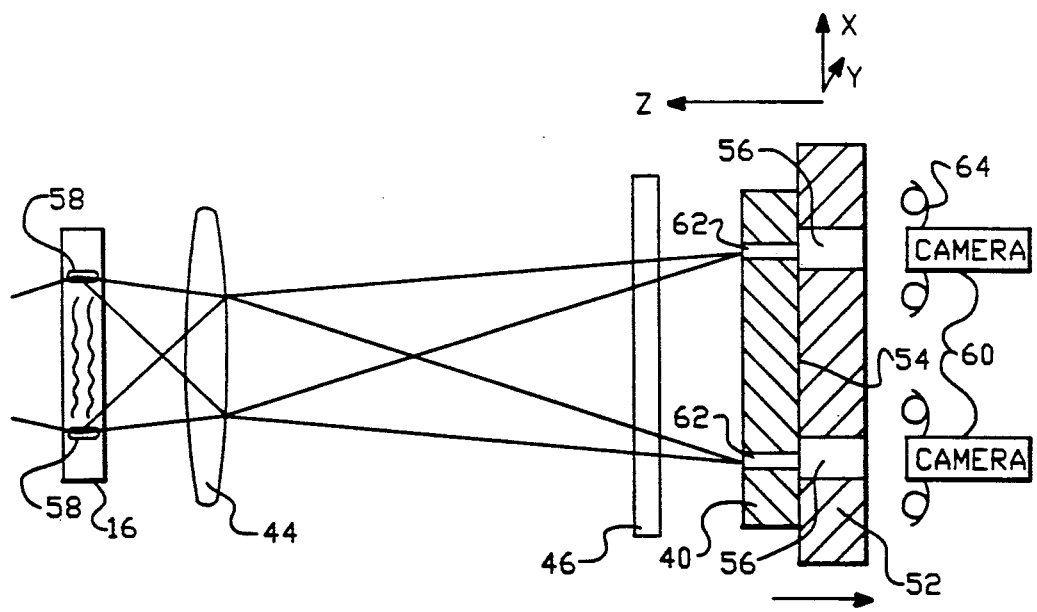

FIGS. 2A and 2B illustrate a method according to the present invention whereby the substrate 40 to be exposed is positioned alignedly by optical registration. Although not shown in FIG. 1, the pattern exposure assembly 12 is provided with a platen 52 with means (not shown) for controllably changing its position and orientation. The platen 52 has a flat front surface 54 facing the projection lens 44 and two windows 56 formed therethrough. Each LCC to be positioned at 16 has two black circles or other geometric alignment structure such as crosshairs or polygons 58 laser-written thereon in addition to the desired pattern. Before the substrate 40 is placed on the flat surface 54 of the platen 52, the platen moving means is operated such that the front surface 54 of the platen 52 comes to the position (as shown in FIG. 2A) which will be occupied by the front surface of the substrate 40 (as shown in FIG. 2B) for exposure. Cameras 60, which are secured to the frame (not shown) of the pattern exposure assembly 12 and hence remain independent of the x, y position or orientation of the platen 52, are disposed behind the individual windows 56. The cameras 60 move with the platen 52 in this operation only, i.e., they move in the z-direction. The positions of the circles or other alignment means 58 marked on the LCC 16 are so selected that their images are formed respectively on each of the windows 56 as shown in FIG. 2A when the front surface 54 of the platen 52 is at the position to be occupied by the front surface of the substrate 40. The two-dimensional positions (coordinates) of the focused images of these circles 58 as viewed through the windows 56 by the cameras 60 are recorded. Next, the substrate 40 is disposed on the front surface 54 of the platen 52 and the platen 52 is retracted as shown by an arrow in FIG. 2B such that the front surface of the substrate 40 facing the projection lens 44 comes to the position occupied by the front surface 54 of the platen 52 as shown in FIG. 2A. The back surface of the substrate 40 has two reference holes drilled therethrough 62 correspondingly opposite from the positions on the front surface of the substrate 40 where the images of the black circles 58 on the LCC 16 are desired to be formed. With the aid of lamps 64 disposed adjacent to the cameras 60, these reference holes 62 on the reflecting back surface of the substrate 40 can be viewed through the windows 56 (with the projection light shuttered off) and their two-dimensional positions (coordinates) can be similarly determined by the cameras 60. If the positions of the focused images determined in the first step shown in FIG. 2A and those of the reference circles 62 on the back surface of the substrate 40 do not match, the platen 52 is moved until their coordinates match, or until their differences become less than a predetermined minimum value. These positioning operations are carried out automatically by using precision stepping motors in a much shorter period of time and with higher accuracy than could be achieved by a human operator. It is an important contributor to achieving low $t_d$ and hence high board exposure throughput.

The foregoing description of a preferred embodiment of the invention has been presented for purposes of illustration and description. It is not intended to be exhaustive or to limit the invention to the precise form disclosed, and many modifications and variations are possible in light of the above teaching.

For example, the present invention is not limited to the use of transmissive cells. Although the conventional wisdom said that the highest contrast ratios are obtainable only by the use of transmissive cells, reflective cells have some important advantages. Firstly, the reflecting coatings can be optimally designed for maximum performance resulting in very little absorption at the peak sensitivities of the photoresist while absorbing essentially all the laser writing energy. Transmission cells will generally absorb more projection light than an optimized reflection cell. Secondly, due to the relatively low optical absorptions which can be achieved with reflection cells, a projection light source of very high brightness and power can be used and hence the exposure time can be reduced with less constraint by internal heating of the liquid crystal cell. With an exposure system employing a transmission cell, the highest contrast and shortest exposure times cannot generally be achieved at the same time because the smaller projection aperture required for the higher contrast, blocks more light, necessitating a lamp of higher brightness or intensity to maintain the short exposure time. But the heat then absorbed by the cell may become prohibitive. Thirdly, a higher contrast ratio can be had for a given cell thickness and the size of the scattering region because light passes through the cell twice rather than only once. Fourthly, a faster writing speed is possible for a given level of laser energy because the cell absorption layer can be designed for nearly 100% absorption.

Figure 3:
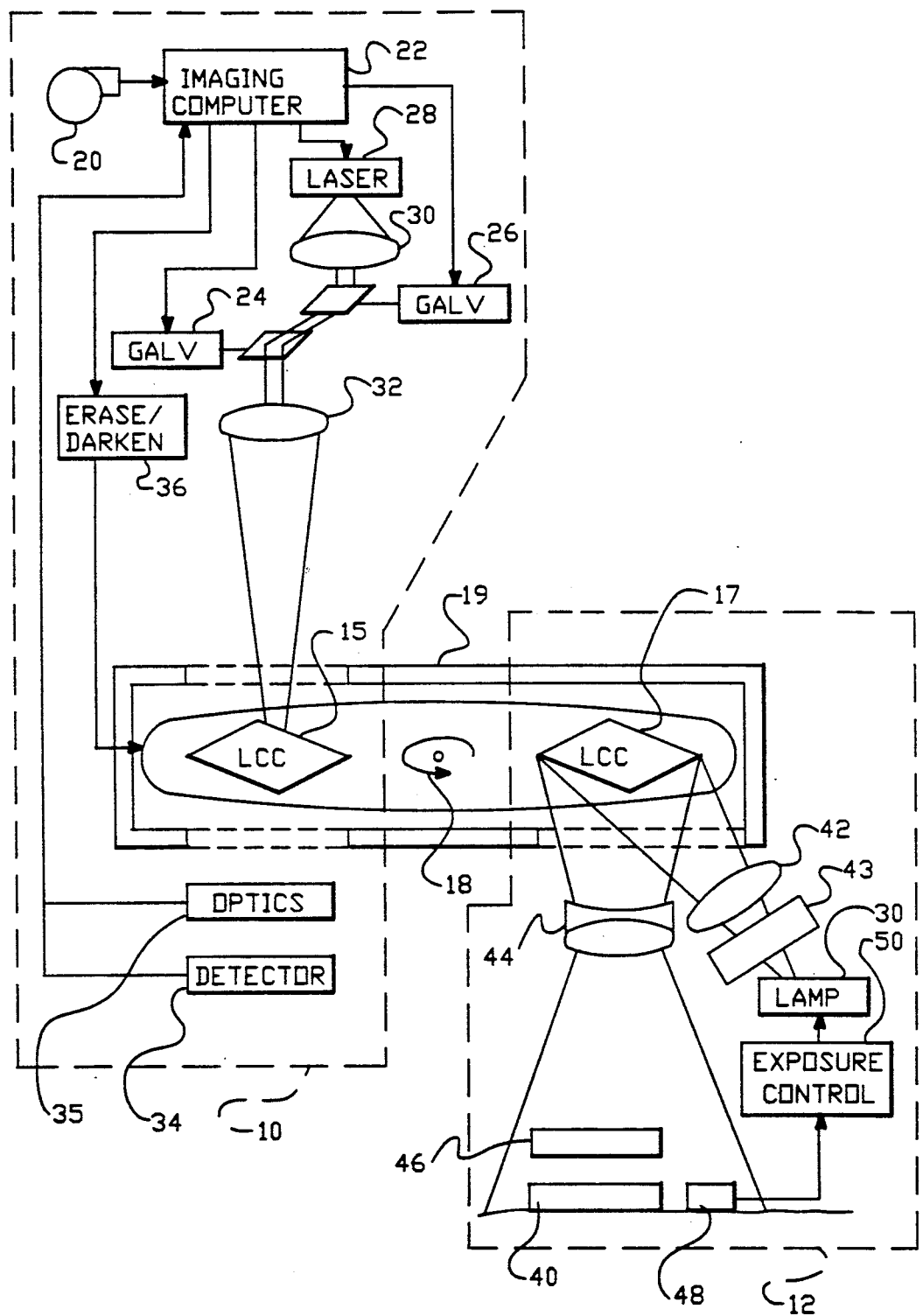
FIG. 3 is a schematic and block diagram illustrating another apparatus embodying the present invention.

FIG. 3 shows another apparatus embodying the present invention, characterized as using a reflective cell instead. In FIG. 3, numerals 15 and 17 indicate reflective mode LCCs made, for example, from a material composed of a mixture of cyanoalkyl biphenyl and cyanoalkoxy biphenyl molecules in the form of a thin layer sandwiched between a transparent electrode layer and a reflector/absorber layer as shown in U.S. patent to be issued to the present assignee on application Ser. No. 169,097 filed Mar. 8, 1988 which is a continuation of application Ser. No. 914,640 filed Oct. 2, 1986 and now abandoned. The reflector/absorber layer serves to effectively separate the image writing space from the image exposing space.

A high intensity exposure light source can be utilized with substantially shorter exposure time with resultant increase in production throughput. Relatively low power lasers such as a 40 mW CW semiconductor laser, for example, can be used to achieve practical writing times of 6-8 minutes for a moderately complex wiring pattern. With the system disclosed herein, lines and spaces less than 0.005 inch in width with good sidewall properties are obtained. Improved image uniformity and increased production throughput are also realized with the novel apparatus and method disclosed herein.

An important feature of the imaging system of the present invention is the ability to write both positive (bright on dark) and negative (dark on bright) projected images without sacrificing the writing time or image quality. This is made possible by the fast (parallel) darkening capability explained above in connection with FIG. 1 whereby a dark background can be created in an instant. Bright vector images are subsequently scanned into this dark background. This capability is important because some printed wiring boards are fabricated by using an additive process (adding copper to the board) while some are fabricated by using a subtractive (etching copper from the board). Resists for PWBs are generally negative working at present but may change to positive working as PWB resolution requirements increase in the future. Laser raster exposure systems can also form either positive or negative images but have lower throughput because the full pattern must be laser-scanned for each exposed board.

An additional advantage of the present invention is that the pattern written in the LCC 16 can be edited efficiently. As soon as the substrate 40 is exposed to radiation reflected from the pattern-carrying LCC 16 and processed to have a pattern formed thereon, this pattern is compared with a reference pattern by whatever means known in the art and any changes or corrections to be effected can be directly inputted (on line) to the imaging computer 22 to have a corrected pattern written by the pattern writing assembly 10. These corrections can compensate for distortions, aberrations, spacial variations in process, process anisotropies, and other nonuniformities observed by the user or operator. Systematic corrections can be provided by corrector plate 46 as required.

Another significant feature of the present invention is that shading correction with precise electronic exposure control as explained above by way of FIG. 1 enables printing of boards with relatively low contrast ratio projected images. As explained above, the conventional wisdom said that contrast ratios in excess of 1000:1 are required but our detailed studies have shown that most of this contrast requirement is for compensating for variations in exposure and processing equipment performance. These variations include both spatial and temporal variations in illumination intensity and in resist development. According to the present invention, as explained above, the projection system is designed to give relatively uniform illumination over the entire printing area. The electronic exposure control 50 with the dose monitor 48 effectively control the exposure. Although not specifically shown in the figures, shading correction means may be provided to enable the operator to vary the laser-written image on the cell 14 in such a manner as to balance out any residual spatial variations in the projected image intensity or in the development process. This may be done by means of a lookup table and algorithm enabling the laser-on time for writing the cell image to be scaled by a factor which varies with the written position on the cell and hence with the image location. Such a lookup table may be inputted by the user in any of the standard manners such as by keyboard operation or from a magnetic disk. The inputted values may be stored in hardware. The shading correction system may include means for interpolating from discrete values inputted by the user, thereby minimizing any steps in projected intensity across the boundaries of adjacent zones corresponding to different input values. It is a feature of this invention that it provides a combined artwork generator and printing system, thereby making possible on-line process and pattern corrections unachievable with other resistive exposure systems.

The teachings presented herein are directly applicable also to printing on other types of hard copy media such as other photopolymers, photochromics and diazos and not limited to photoresists, printed circuit boards and printed wiring boards. Although preferred embodiments of the present invention were described above wherein a wheel is provided to transport a LCC from a position in the pattern writing assembly to another in the pattern exposure assembly such that the image in one cell can be projected onto a substrate while another pattern is being written into a different LCC. this is not intended to limit the scope of the invention. The pattern writing and pattern exposure assemblies of the present invention may be separated and, alternatively, the apparatus according to the present invention may be so arranged that the cell remains stationary while a pattern is recorded therein and the recorded pattern is simultaneously or sequentially projected although such additional embodiments are not separately illustrated. Any such modifications and variations that may be apparent to a person skilled in the art are intended to be included within the scope of this invention.

What is claimed is:

1. An apparatus for exposing a substrate sensitive in a particular way to radiation of a specific wavelength by projecting an image from a liquid crystal cell to produce a hard copy having a predetermined pattern, said apparatus comprising:
   (a) means for supporting said liquid crystal cell;
   (b) means for establishing an image of said predetermined pattern within said liquid crystal cell;
   (c) a source of radiation within a particular wavelength range including said specific wavelength;
   (d) exposure means for directing said radiation to said liquid crystal cell and thereafter onto said substrate in a way which projects said image within the cell onto the substrate, thereby exposing said substrate to said image; and
   (e) exposure control means for controlling the total amount of said radiation which is directed onto said substrate from said liquid crystal cell, said exposure control means including means for measuring the amount of incident radiation that falls on the image plane of said substrate from said liquid crystal cell, thereby precisely controlling the amount of radiation to which said substrate is exposed;
   (f) said substrate being placed in a specific image receiving position within a given plane prior to projection of said image within the cell onto the substrate, said image within said liquid crystal cell including first alignment indicia and said substrate including corresponding second alignment indicia, and the apparatus further comprising means for projecting the image of said first alignment indicia onto said given plane, said substrate also including
   (i) a platen having a front surface for supporting said substrate within said given plane and a back surface opposite said front surface,
   (ii) an arrangement including camera means located on the back surface side of said platen for optically establishing from the back surface side of the platen the positions of the projected image of said first alignment indicia and second alignment indicia with respect to one another, and
   (iii) means for moving said platen and its supported substrate, if necessary, in order to place said second alignment indicia in substantial alignment with the projected image of said first alignment indicia, and to thereby place said substrate in said image receiving position.

2. An apparatus according to claim 1 wherein said measuring means includes a detector located in said image plane in close proximity to said substrate.

3. An apparatus according to claim 1 wherein said specific wavelength range of said radiation includes the 405 nm wavelength which is the mercury line and wherein said exposure means includes filter means for preventing the 405 nm line from reaching said liquid crystal cell and said substrate.

4. An apparatus according to claim 3 wherein said filter means allows substantially only said specific wavelength to reach said liquid crystal cell and said substrate.

5. An apparatus according to claim 4 wherein said specific wavelength is 436 nm.

6. An apparatus according to claim 1 wherein said exposure means projects the entirety of the image within the liquid crystal cell onto the substrate at the same instant.

7. An apparatus according to claim 1 wherein said liquid crystal cell is a transmissive cell and radiation is transmitted through said cell.

8. An apparatus according to claim 1 wherein said liquid crystal cell is a reflective cell and radiation is reflected from said cell.

9. An apparatus according to claim 1 wherein said means for establishing an image and said exposure means can operate simultaneously.

10. An apparatus according to claim 1 wherein said exposure control means includes a control circuit responsive to said measuring means for computing the total radiation directed to said substrate and means for terminating said radiation when a predetermined dose has been delivered.

11. An apparatus according to claim 10 wherein said means for terminating includes a shutter positioned in the path of said radiation, said shutter responsive to said control circuit to close upon termination of exposure of the substrate.

12. A system for exposing a substrate in a specific image receiving position within a given plane by projection imaging, said system comprising:
   (a) a first, image forming station for supporting a first liquid crystal cell;
   (b) a second, image projecting station for supporting a second, image-bearing liquid crystal cell in one position and a substrate to be exposed in a second position;
   (c) first means for forming an image in said first liquid crystal cell when said first liquid crystal cell is supported within said first station, said image forming means including
      (1) means for storing and processing image data; and
      (2) light beam scanning means responsive to said storing and processing means for scanning the liquid crystal cell in said first station in accordance with said image data so as to write an image in said cell in said first station, said light beam scanning means including
         (i) emitting means for providing a light beam,
         (ii) guiding means for moving and positioning said light beam to scan the liquid crystal cell in said first station, and
         (iii) computer means for providing data to said guiding means to control the scanning of said light beam and (d) second means operating independently of and simultaneously with the operation of said first means for exposing a substrate located at said second position by directing radiation onto said second, image-bearing cell located at said first position and projecting the image onto the substrate.

13. The apparatus of claim 12 wherein said light beam is a laser beam.

14. A system according to claim 12 further comprising means for transferring said liquid crystal cells between said first and second stations.

15. A system according to claim 14 wherein said transferring means includes a movable carousel for supporting said cells in a fixed position thereon as the cells move between stations.

16. A system according to claim 51 wherein said movable carousel is a rotatable wheel.

17. A system according to claim 12 wherein said image forming means includes means for erasing a previously formed image in said first liquid crystal cell.

18. A system according to claim 17 wherein said erasing means includes means for creating a dark background and means for creating a bright background.

19. A system according to claim 12 wherein said second, image projecting station includes:
(a) first alignment indicia forming part of the image of said image bearing member and corresponding second alignment indicia on said substrate;
(b) means for projecting the image of said first alignment indicia onto said given plane;
(c) a platen having a front surface for supporting said substrate within said given plane and a back surface opposite said front surface;
(d) an arrangement including camera means located on the back surface side of said platen for optically establishing from the back surface side of the platen the positions of the projected image of said first alignment indicia and second alignment indicia with respect to one another; and
(e) means for moving said platen and its supported substrate, if necessary, in order to place said second alignment indicia in substantial alignment with the projected image of said first alignment indicia, and to thereby place said substrate in said image receiving position.

20. An apparatus according to claim 12 wherein the second, image projecting station includes:
(a) a source of radiation within a particular wavelength range including said specific wavelength;
(b) exposure means for directing said radiation to said second, image bearing liquid crystal cell and thereafter onto said substrate in a way which projects said image within said cell onto the substrate, thereby exposing said substrate to said image; and
(c) exposure control means for controlling the total amount of said radiation which is directed onto said substrate from said liquid crystal cell, said exposure control means including means for measuring the amount of incident radiation that actually falls on the image plane of said substrate from said liquid crystal cell, thereby precisely controlling the amount of radiation to which said substrate is exposed.

21. An apparatus for exposing a substrate by projection imaging, said apparatus comprising:
(a) rotatable means for supporting two image-carrying liquid crystal cells, one cell being supported in a first position, the other cell being supported in a second position;
(b) means for producing an image in the liquid crystal cell at the first position; said image forming means including
(1) means for storing and processing image data; and
(2) light beam scanning means responsive to said storing and processing means for scanning the liquid crystal cell in said first position in accordance with said image data so as to write an image in said cell in said first position, said light beam scanning means including
(i) emitting means for providing a light beam,
(ii) guiding means for moving and positioning said light beam to scan the liquid crystal cell in said first position, and
(iii) computer means for providing data to said guiding means to control the scanning of said light beam
(c) means for exposing a substrate by directing radiation onto the image carrying cell at the second position and projecting the image therein onto a substrate substantially simultaneously with the production of an image in the liquid crystal cell at the first position; and
(d) means for intermittently rotating the support means to switch the two liquid crystal cells between the first and second positions.

22. The apparatus of claim 21 wherein said light beam is a laser beam.

23. A system for exposing a substrate in a specific image receiving position within a given plane by projection imaging, said system comprising:
(a) a first, image forming station for supporting a first liquid crystal cell;
(b) a second, image projecting station for supporting a second, image-bearing liquid crystal cell in a first position, said second liquid crystal cell having first alignment indicia forming part of said image, and for supporting a substrate which is to be exposed, said substrate having corresponding second alignment indicia, said image projecting station including
i) means for projecting the image of said first alignment indicia onto said given plane,
ii) a platen having a front surface for supporting said substrate within said given plane and a back surface opposite said front surface,
iii) an arrangement including camera means located on the back surface side of said platen for optically establishing from the back surface side of the platen the positions of the projected image of said first alignment indicia and second alignment indicia with respect to one another, and
iv) means for moving said platen and its supported substrate, if necessary, in order to place said second alignment indicia in substantial alignment with the projected image of said first alignment indicia, and to thereby place said substrate in said image receiving position;
(c) first means for forming an image in said first liquid crystal cell when said first liquid crystal cell which is supported within said first station; and
(d) second means operating independently of and simultaneously with the operation of said first means for exposing a substrate located at said second position within said second station by directing radiation onto said second liquid crystal cell located at said first position and projecting the image therein onto the substrate located at said second position, said exposure means including exposure control means for controlling the total amount of radiation which is directed onto said substrate from said liquid crystal cell, said exposure control means including means for measuring the amount of incident radiation that falls on the image plane of said substrate from said liquid crystal cell, thereby precisely controlling the amount of radiation to which said substrate is exposed.

24. A system for exposing a substrate located at a specific image receiving position within a given plane by projection of an image from an image-bearing liquid crystal cell onto the substrate, said image having first alignment indicia, said substrate having corresponding second alignment indicia, said system comprising:
 (a) first and second liquid crystal cells;
 (b) a first, image forming station;
 (c) a second, image projecting station;
 (d) movable means for supporting said first liquid crystal cell within said first, image forming station and for supporting said second liquid crystal cell within said second, image projection station,
 (e) means for forming said image in the liquid crystal cell which is supported within said first, image forming station, said image forming means including
  i) means for erasing a previous image, if any, in the first liquid crystal cell to create an image-free liquid crystal cell, and
  ii) means for forming an image in the image-free liquid crystal cell including emitting means for providing a laser beam,
  iii) guiding means for moving and positioning said laser beam to scan the liquid crystal cell and form an image therein, and
  iv) a computer means for controlling said guiding means in response to image data;
 (f) means for placing the substrate within the image projection station at said image receiving position, said placing means including
  i) means for projecting the image of said first alignment indicia onto said given plane,
  ii) a platen having a front surface for supporting said substrate within said given plane and a back surface opposite said front surface,
  iii) an arrangement including camera means located on the back surface side of said platen for optically establishing from the back surface side of the platen the positions of the projected image of said first alignment indicia and second alignment indicia with respect to one another, and
  iv) means for moving said platen and its supported substrate, if necessary, in order to place said second alignment indicia in substantial alignment with the projected image of said first alignment indicia, and to thereby place said substrate in said image receiving position;
 (g) means operating independently of and simultaneously with the operation of said image forming means for exposing a substrate located at said specific image receiving position within said second station, said exposing means including
  i) a controllable source of radiation,
  ii) an optical assembly for directing radiation at the image-bearing liquid crystal cell within said second station and projecting the image therein onto the substrate at said image receiving position to expose the substrate, and
  iii) exposure control means for controlling the total amount of radiation which is directed onto said substrate, said exposure control means including means for measuring the amount of incident radiation that falls on the given plane of said substrate, and to thereby precisely controlling the amount of radiation to which said substrate is exposed; and
 (h) means for intermittently moving said support means to switch the two liquid crystal cell between the two stations.

25. A system for exposing a substrate in a specific image receiving position within a given plane by projection imaging, said system comprising:
 (a) a first, image forming station for supporting a first liquid crystal cell;
 (b) a second, image projecting station for supporting a second, image-bearing liquid crystal cell in one position and a substrate to be exposed in a second position;
 (c) first means for forming an image in said first liquid crystal cell when said first liquid crystal cell is supported within said first station;
 (d) second means operating independently of and simultaneously with the operation of said first means for exposing a substrate located at said second position by directing radiation onto said second, image-bearing cell located at said first position and projecting the image onto the substrate; and
 (e) means for transferring said liquid crystal cells between said first and second stations.

* * * * *